(12) United States Patent
Chen et al.

(10) Patent No.: US 11,812,674 B2
(45) Date of Patent: *Nov. 7, 2023

(54) SYSTEMS AND METHODS FOR PHASE CHANGE MATERIAL BASED THERMAL ASSESSMENT

(71) Applicant: Taiwan Semiconductor Manufacturing Co., Ltd., Hsin-Chu (TW)

(72) Inventors: Chien-Mao Chen, Zhubei (TW); Hung-Jen Hsu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/336,217

(22) Filed: Jun. 1, 2021

(65) Prior Publication Data
US 2021/0288254 A1    Sep. 16, 2021

Related U.S. Application Data

(63) Continuation of application No. 16/373,379, filed on Apr. 2, 2019, now Pat. No. 11,031,556.

(30) Foreign Application Priority Data

Dec. 6, 2018  (CN) .......................... 201811489868.7

(51) Int. Cl.
*H10N 70/00*  (2023.01)
*H01L 21/66*  (2006.01)
*H01L 21/67*  (2006.01)
*H10N 70/20*  (2023.01)

(52) U.S. Cl.
CPC ..... *H10N 70/041* (2023.02); *H01L 21/67248* (2013.01); *H01L 22/14* (2013.01); *H10N 70/023* (2023.02); *H10N 70/231* (2023.02); *H10N 70/8828* (2023.02)

(58) Field of Classification Search
CPC ........... H01L 45/1641; H01L 21/67248; H01L 22/14; H01L 45/06; H01L 45/144; H01L 45/1616; H01L 45/141
See application file for complete search history.

(56) References Cited

U.S. PATENT DOCUMENTS

| 2006/0172067 A1* | 8/2006 | Ovshinsky ............ C23C 16/305 |
| | | 427/532 |
| 2007/0014047 A1 | 1/2007 | Cho et al. |
| 2007/0126040 A1 | 6/2007 | Lung |
| 2008/0042119 A1* | 2/2008 | Sandoval ............. H10N 70/231 |
| | | 257/E47.001 |

(Continued)

FOREIGN PATENT DOCUMENTS

TW          200843007 A       11/2008

*Primary Examiner* — Ahmed N Sefer
(74) *Attorney, Agent, or Firm* — Duane Morris LLP

(57) ABSTRACT

In an embodiment, a method includes: growing a phase change material on a platform configured for a semiconductor workpiece process; setting the phase change material to an amorphous state; performing the semiconductor workpiece process within a semiconductor processing chamber; and measuring resistance across two points along the phase change material.

20 Claims, 9 Drawing Sheets

(56) References Cited

U.S. PATENT DOCUMENTS

| | | | |
|---|---|---|---|
| 2008/0286446 A1* | 11/2008 | Kamepalli | H10N 70/023 |
| | | | 257/E21.294 |
| 2009/0087965 A1 | 4/2009 | Pinnow et al. | |
| 2009/0263934 A1* | 10/2009 | An | H01L 45/1616 |
| | | | 438/102 |
| 2010/0203709 A1 | 8/2010 | Czubatyj | |
| 2010/0254425 A1 | 10/2010 | Habib et al. | |
| 2012/0307552 A1* | 12/2012 | Perniola | H01L 45/06 |
| | | | 438/102 |
| 2013/0258767 A1 | 10/2013 | Krebs et al. | |
| 2014/0119110 A1* | 5/2014 | Lung | G11C 13/0069 |
| | | | 365/163 |
| 2014/0355338 A1* | 12/2014 | Perniola | H01L 45/144 |
| | | | 365/163 |
| 2015/0340089 A1 | 11/2015 | Stojcevska et al. | |
| 2016/0372661 A1* | 12/2016 | Cheng | H01L 45/1625 |
| 2017/0307310 A1 | 10/2017 | Wang et al. | |
| 2019/0067572 A1* | 2/2019 | Tsai | H10N 70/8613 |

* cited by examiner

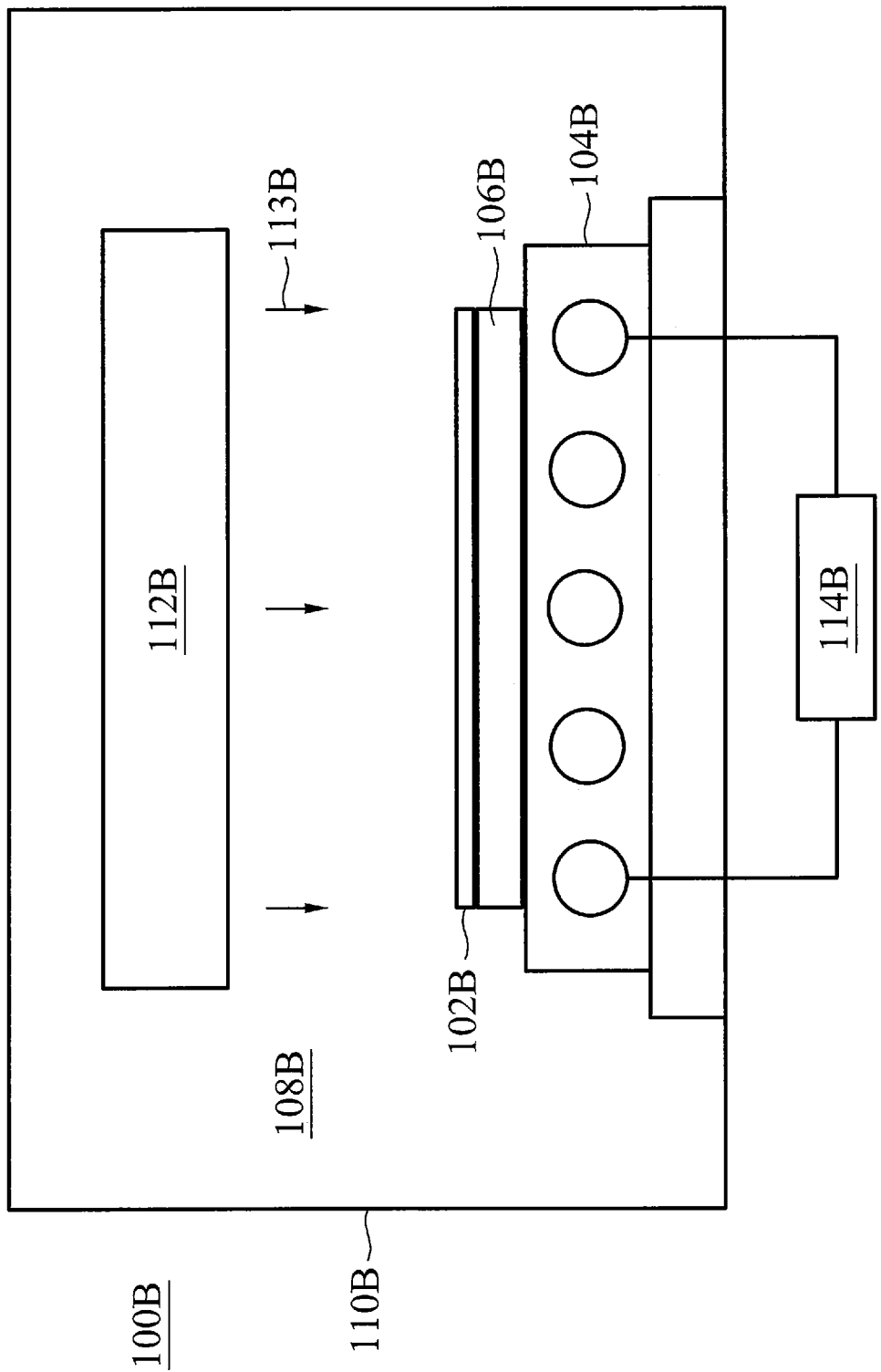

SYSTEMS AND METHODS FOR PHASE CHANGE MATERIAL BASED THERMAL ASSESSMENT

CROSS-REFERENCE TO RELATED APPLICATION

This application is a continuation application of U.S. patent application Ser. No. 16/373,379, filed Apr. 2, 2019, which is incorporated by reference herein in its entirety.

BACKGROUND

Several applications that involve thermal processing of wafers or semiconductor workpieces in semiconductor workpiece fabrication processes and other materials involve the process of rapidly heating and cooling a semiconductor workpiece. Examples of such processing include rapid thermal processing (RTP), physical vapor deposition (PVD), dynamic surface annealing (DSA) and the like, which are used for a number of semiconductor fabrication processes. These processes are often thermally based and typically involve high process temperatures ranging from, for example, 200 degrees Celsius to 1,600 degrees Celsius, which can result in significant thermal budget issues that may adversely affect device performance.

Processing chambers utilized in semiconductor workpiece fabrication processes typically comprise a number of components that are repeatedly heated and cooled during and after performance of these thermally based processes. Accordingly, it is important that the temperature be accurately and effectively monitored for these fabrication processes. However, conventional temperature monitoring and control techniques may require large amounts of overhead and expensive hardware, but still fail to produce satisfactory results. Therefore, conventional temperature monitoring and control techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 1B is a cross sectional view of a chamber with phase change material grown on a wafer, in accordance with some embodiments.

DETAILED DESCRIPTION OF EXEMPLARY EMBODIMENTS

Figure 1A:
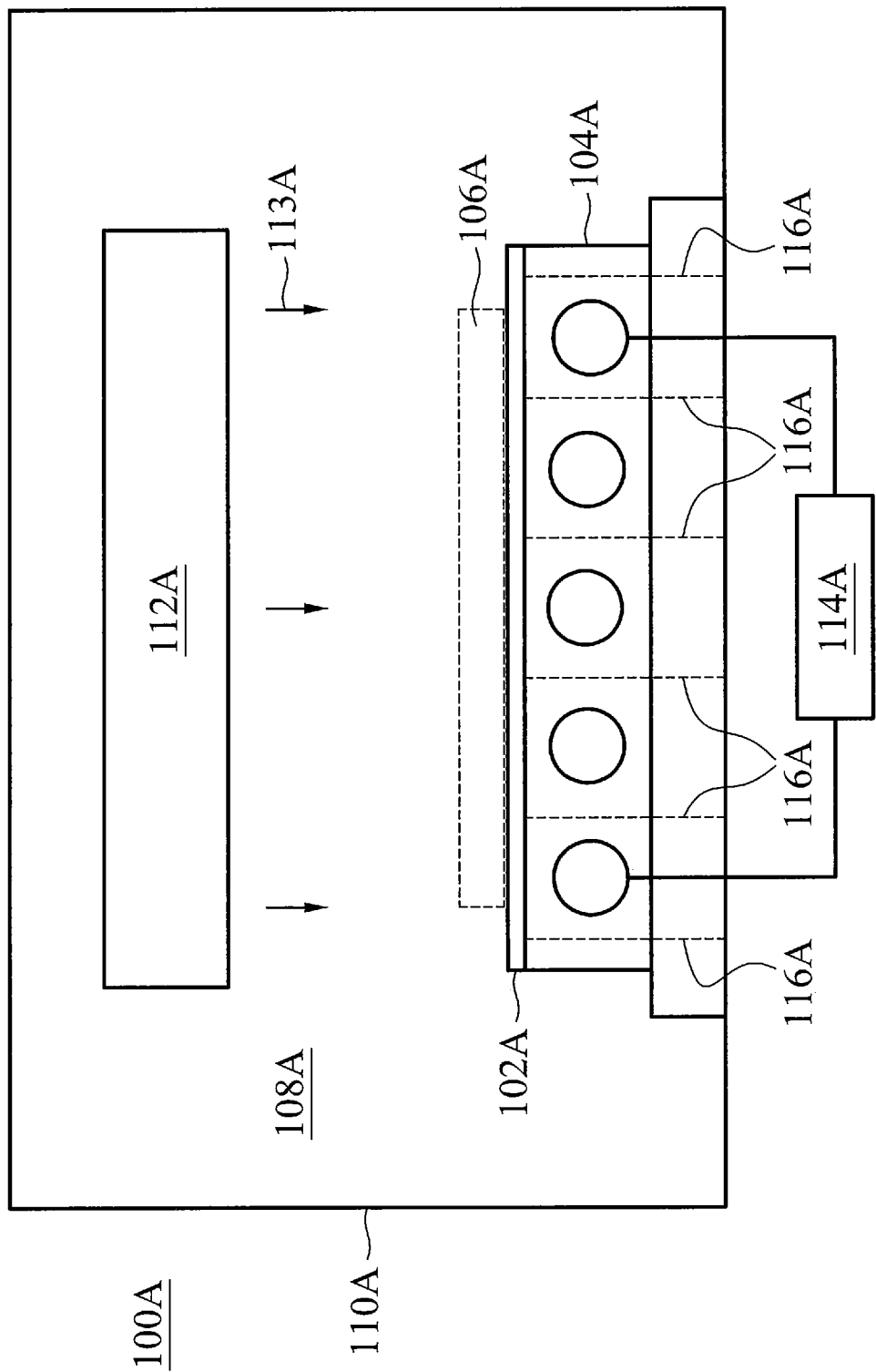
FIG. 1A is a cross sectional view of a chamber with phase change material grown on a solid support structure, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As introduced above, processing chambers utilized in semiconductor workpiece fabrication processes comprise a number of components that may be repeatedly heated and cooled during and after performance of thermally based processes. Traditionally, assessment or monitoring of thermal performance within the chamber during the semiconductor workpiece fabrication processes occurred via measuring a change in a known resistance of a doped test wafer or via measuring black body radiation from a processed test wafer. A test wafer may refer to a wafer that is tested for assessment of thermal performance, as opposed to a workpiece wafer that is a semiconductor processing workpiece being processed for a semiconductor device. However, the test wafers utilized in these traditional methods of assessing thermal performance or changes within a chamber are typically disposable and not reusable. This may be because their originally known resistance or black body radiation features are unable to be reset after undergoing a semiconductor workpiece fabrication process.

Accordingly, the present disclosure provides various embodiments of assessing thermal performance of semiconductor workpiece fabrication processes utilizing phase change materials that may be reset rapidly and/or at will. These phase change materials may be located at any relevant location within a chamber, such as at platforms utilized for wafer placement or thermal processing. For example, the phase change materials may be located on a support structure for a wafer (e.g., a workpiece wafer or a test wafer), along a surface of a test wafer, or on an energy element (e.g., a heater) used for changing the temperature or energy dosage within the chamber. Advantageously, a test wafer need not be utilized when the phase change material is disposed in situ within the chamber (e.g., when along an energy element or a wafer support structure). Furthermore, these phase change materials may be grown in situ within the chamber or may be grown on a test wafer outside of the chamber and disposed in the chamber in place of a workpiece wafer (e.g., a wafer that is to be processed into a final semiconductor device). These chambers may be utilized in any type of tool (and utilized in any corresponding semiconductor workpiece fabrication processes that maybe performed in such chambers), such as rapid thermal processing (RTP) tools, rapid thermal anneal (RTA) tools, physical vapor deposition (PVD) tools, chemical vapor deposition (CVD) tools, dynamic surface annealing (DSA) tools, chemical mechanical planarization (CMP) tools, diffusion (DIF) tools, wet etching tools, dry etching tools, and the like. The functionalities and configurations of each tool is conventional (e.g., well known) and will not be discussed in detail herein for brevity.

These phase change materials may be set to an amorphous state with a known high resistance utilizing an energy pulse (e.g., an electrical or light pulse). Then, the phase change materials may crystalize due to thermal exposure during the semiconductor workpiece fabrication process and decrease in resistance based on the amount of thermal exposure. This decrease in resistance may be measured and analyzed accordingly, with different measurement values being associated with a particular thermal change. Also, by being grown, the phase change materials may be deposited directly (e.g., sprayed on) or deposited epitaxially (e.g., crystalline deposition on a crystalline substrate). During and/or after the performance of the relevant semiconductor workpiece fabrication process, the resistance of the phase change material at any target location (e.g., across two points) may be measured and analyzed for thermal performance assessment.

As noted above, the phase change material may be reset rapidly and at will (e.g., by utilizing the above mentioned energy pulse) to an amorphous state with a known high resistance value. Advantageously, by being resettable, the items and materials utilized for thermal performance assessment may be reused and not discarded after each use. Also, by being resettable, assessments need not wait until the thermal process is complete before assessment. Rather, assessments may be made at any of a variety of granularities, such as within and up to the megahertz (MHz) or a million times per second. This may allow for practically continuous monitoring of thermal changes during a semiconductor workpiece fabrication process. In being reset, the phase change material may switch between its high conductive amorphous and low conductive crystalline states by Joule heating induced by energy pulses (e.g., electrical pulses). The rapid and reversible structural changes results in a change in material resistivity. The transition from the amorphous state to the crystalline state may be referred to as a crystalline set transition, and the transition from crystalline state to the amorphous state may be referred to as a reset transition. An example phase change material may be GeSbTe alloy, similar to that utilized in PCRAM. To switch to an amorphous state, a short reset pulse with high current may increase the temperature of the phase change material to a value above the melting point. After the pulse, the molten state cools rapidly (e.g., $10^{11}$ K/s) and is quenched into the amorphous state. To convert the material into a crystalline state, a relatively longer set pulse with a medium current (e.g., a current lower than and a time longer than the high current referenced above for a reset transition) may be applied by an energy element in the normal course of a semiconductor workpiece fabrication process to heat the material above its crystallization temperature but below the melting point. The duration of the set pulse may be longer than the material dependent crystallization time. When measuring resistance, a much lower current with essentially no Joule heating may be used. Further details of setting and resetting phase change materials may be conventional and will not be discussed in detail herein for brevity.

In numerous embodiments, specific phase change materials may be utilized, as noted in Table 1 below. These phase change materials may be grown in a conventional manner, and detailed aspects of growing these phase change materials will not be discussed in detail herein. Although specific phase change materials are specifically noted, other phase change materials (e.g., a substance with a high heat of fusion which, melting and solidifying at a certain temperature, is capable of storing and releasing large amounts of energy) may be utilized as appropriate for different applications in various embodiments.

TABLE 1

Exemplary Phase Change Materials

| Binary | Ternary | Quaternary |
| --- | --- | --- |
| GaSb | $Ge_2Sb_2Te_3$ | AgInSbTe |
| InSb | InSbTe | (GeSn)SbTe |
| InSe | GaSeTe | GeSb(SeTe) |
| $Sb_2Te_3$ | $SnSb_2Te_4$ | $Te_{81}Ge_{15}Sb_2S_2$ |
| GeTe | $Ge_1Sb_2Te_4$ | $GeSbBiTe_4$ |
| Sb7Te3 | $Ge_{25}AS_{50}Te_{25}$ | GeTeSbS |
| In2Se3 | $Ge_1Sb_4Te_7$ | GeTeInGa |

Various different wafer support structures will be discussed further below, such as solid support structures and open support structures in different types of processing chambers. Processing chambers may also be referred to more simply as a "chamber." A difference between a solid support processing chamber (e.g., a processing chamber with a solid support structure) and an open support processing chamber (e.g., a processing chamber with an open support structure) is an open support processing chamber has an open support that is open underneath a wafer (e.g., a test wafer or a workpiece wafer) and a solid support processing chamber has a solid support that is not open underneath a wafer. Although particular discussion concerning the wafer support structures may be differentiated along the lines of an open support structure or a solid support structure, other types of differentiable wafer support structures may be implemented for different applications in various embodiments. For example, wafers may be secured within a chamber on an open support structure that is a clamp that secures a wafer's extreme edges (e.g., outer circumference) instead of being secured by resting on a support structure. Accordingly, any discussion of particular support structures is non limiting and provided merely to explain that phase change materials may be grown in a chamber with any type of support structure that secures a wafer within a chamber, in accordance with various embodiments. For example, in various embodiments, phase change materials may be grown on a support structure, to the sides of a support structure, above a support structure, or underneath a support structure.

FIG. 1A is a cross sectional view of a solid support processing chamber 100A with phase change material 102A grown on a solid support structure 104A, in accordance with some embodiments. The solid support structure 104A is configured to support (e.g., secure) a wafer 106A (illustrated in phantom) that may rest on or abuts the solid support structure 104A. The location of the wafer 106A when secured within a chamber via a support structure may be referred to as a wafer location. Accordingly, the wafer 106A need not be always present atop the solid support structure 104A. The chamber 100A may include an enclosed processing region 108A that has one or more chamber walls 110A. The chamber 100A may include an energy element 112A that may be activated to control a dose of energy (e.g., heat or light) applied within the enclosed processing region 108A. For example, the energy element 112A may represent one or more physical structures or aspects such as a probe, optical element, or a heating element. Examples of heating elements may include a lamp, such as a halogen lamp or a tungsten halogen lamp that may be mounted into a light pipe and positioned to adequately cover a surface area of a wafer as desired. The probe may be configured to emit an energy pulse that may set a phase change material within the chamber 100A to an amorphous state with a known high resistance utilizing an energy pulse (e.g., an electrical or light pulse). The energy element 112A may be configured to repeatedly deliver a desired dose of energy to the wafer 106A as part of, and in performance of, a semiconductor workpiece fabrication processes. For example, in certain embodiments the energy element 112A may be configured to repeatedly deliver a desired uniform dose of energy 113A across anneal regions on a wafer 106A positioned on the solid support structure 104A (via the phase change material 102A) for preferential annealing and/or melting of desired areas within particular regions of the wafer 106A. In certain embodiments, the energy element 112A may further comprise additional components including a dose control system, a pulse stretcher assembly, a beam homogenizer assembly, and a relay optics system. The temperature of the wafer 106A may be controlled by positioning the wafer 106A in thermal contact with the solid support structure 104A and a heat exchanging device 114A. The heat exchanging device 114A is generally adapted to heat and/or cool the solid support structure 104A prior to, during, and/or after the semiconductor workpiece fabrication processes. In this configuration, the heat exchanging device 114A, such as a conventional substrate heater, may include electrically resistive heating elements, temperature controlled fluid heat exchanger, and the like. The heat exchanging device 114A may be used to improve the post-processing properties of the wafer. Although illustrated as being in a particular orientation in the chamber 100A relative to the enclosed processing region 108A, the energy element 112A may be in any location within or part of the chamber 100A as desired for different applications, in accordance with various embodiments. For example, the energy element 112A may be in a part of the enclosed processing region 108A that is separated by an optically transparent window 136A or may be separated in multiple places within the chamber 100A.

In particular embodiments, during semiconductor workpiece fabrication processing, the enclosed processing region 108A may be evacuated by use of a vacuum pump and/or purged using an inert gas source to reduce the partial pressure of undesirable gases, such as oxygen. The inert gas source may be any inert gas compatible with the chemistry of a coolant. Exemplary inert gases include nitrogen, argon, helium and combinations thereof.

In certain embodiments, the phase change material may interface with a resistance measuring apparatus 116A (e.g., an ohmmeter) with interface points along at least two points of the phase change material. The interface points of the resistance measuring apparatus 116A are drawn as lines in phantom. By being along at least two points of the phase change material, the resistance measuring apparatus 116A may measure the resistance of the phase change material between the at least two points. Also, when the phase change material is on a part of the chamber that is not moved into and out of the chamber (e.g., the wafer 106A), the resistance measuring apparatus 116A may be a fixture of the chamber such that the resistance measuring apparatus, along with the phase change material, remains within the chamber both during thermal performance assessment and throughout all semiconductor workpiece fabrication processes within the chamber 100A. This may contrast with a phase change material that may be temporarily present within the chamber 100A (e.g., moved into and out of the chamber as needed, or during thermal performance assessments). Also, in certain embodiments, the phase change material 102A may be grown in situ within the chamber. In other embodiments the phase change material 102A may be grown on a particular component that the phase change material interfaces with (e.g., the solid support structure 104A) prior to chamber 100A assembly and then subsequently assembled with other components of the chamber 100A to form the chamber 100A.

FIG. 1B is a cross sectional view of a solid processing chamber 100B but with phase change material 102B grown on the wafer 106B, in accordance with some embodiments. Various aspects of FIG. 1B (e.g., the chamber 100B, solid support structure 104B, wafer 106B, enclosed processing region 108B, chamber walls 110B, energy element 112B, energy 113B, and heat exchanging device 114B) may be similar to corresponding aspects of FIG. 1A and will not be repeated here for brevity. However, different than FIG. 1A, FIG. 1B illustrates an embodiment in which the phase change material 102B is grown on the wafer 106B rather than on the solid support structure 104B. Also, the wafer 106B may be a test wafer (in contrast with a workpiece wafer, discussed above). Accordingly, the wafer 106B may be utilized specifically for thermal performance assessment, as opposed to being a semiconductor device workpiece.

As introduced above, the wafer 106B may be inserted into and removed from the chamber 100B during semiconductor workpiece fabrication processes. Also, the phase change material 102B may be grown on the wafer 106B. Accordingly, the phase change material may also be inserted into and removed from the chamber 100B as needed. This may be advantageous in the situations where the phase change material may be too fragile to constantly undergo semiconductor workpiece fabrication processes when not also being utilized for thermal performance assessments. Also, the phase change material 102B may be grown on the wafer 106B when external to the chamber 100B. For example, the phase change material 102B may be grown on the wafer 106B in an environment that is specific to the growth of the phase change material 102B, rather than being grown in situ within the chamber 100B. Furthermore, in certain embodiments, the phase change material 102B may be grown on a specific portion of the wafer 106B, such as along the top of the wafer facing the energy element 112B. However, the phase change material may be grown in any particular location of the wafer as desired for different applications, in various embodiments. For example, as will be discussed below in certain embodiments, the phase change material may be throughout the surface of a wafer.

Figure 1C:
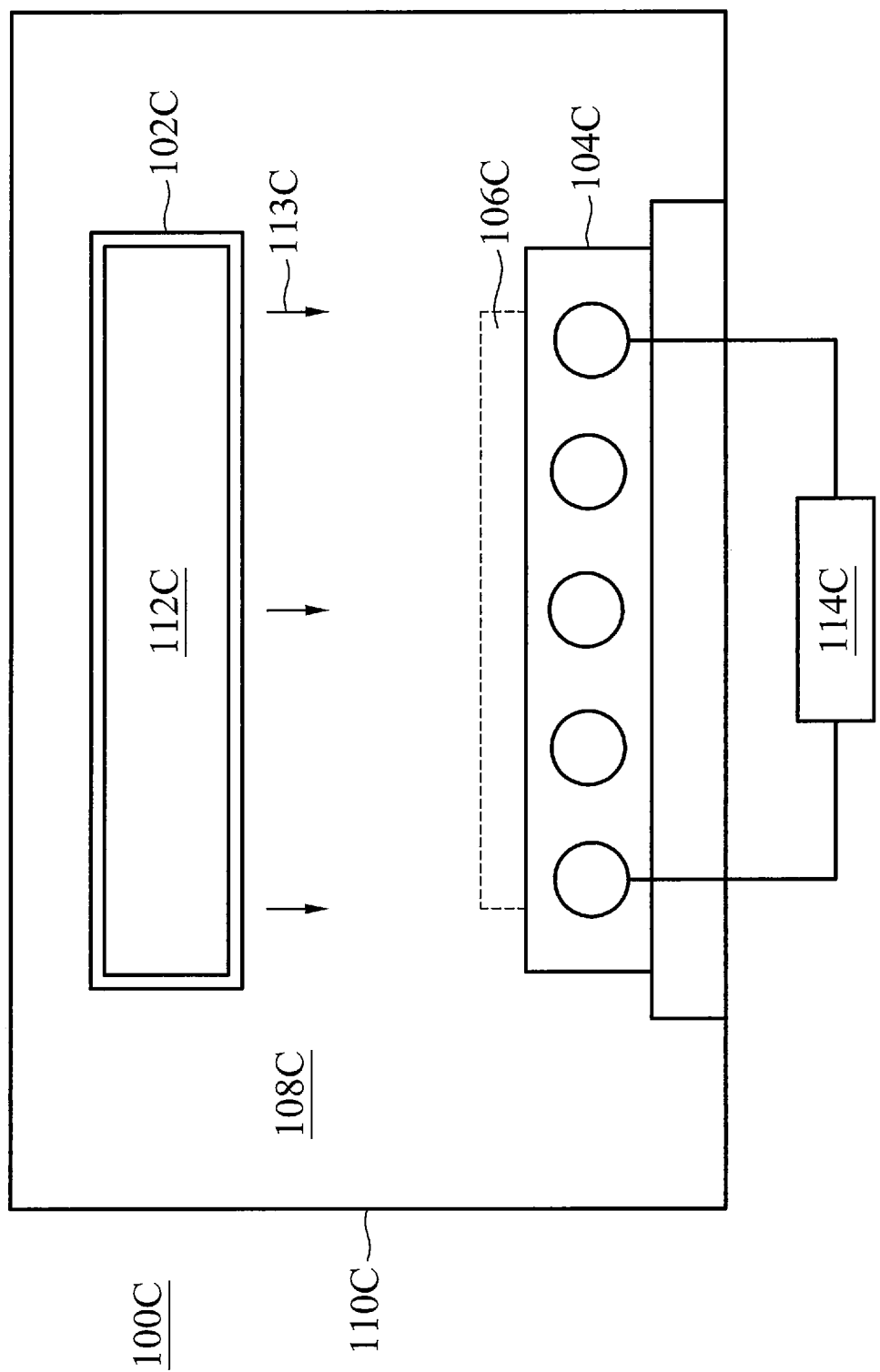
FIG. 1C is a cross sectional view of a chamber with phase change material grown on an energy element, in accordance with some embodiments.

FIG. 1C is a cross sectional view of a solid processing chamber 100C with phase change material 102C grown on an energy element 112C, in accordance with some embodiments. Various aspects of FIG. 1C (e.g., the chamber 100C, solid support structure 104C, wafer 106C, enclosed processing region 108C, chamber walls 110C, energy element 112C, energy 113C, and heat exchanging device 114C) may be similar to corresponding aspects of FIG. 1A and will not be repeated here for brevity. However, different than FIG. 1A, FIG. 1C illustrates an embodiment in which the phase change material 102C is grown on the energy element 112C rather than on the solid support structure 104C.

By being grown on the energy element 112C, the phase change material may more closely reflect the changes at the energy element 112C compared to placing the phase change material at other locations of the chamber 100C. Also, the phase change material 102C may be more easily controlled by a probe of the energy element 112C due to being closer to the probe of the energy element 112C. In certain embodiments, the phase change material 102C may be grown in an intermittent fashion, such that the phase change material covers much but not all of the energy element 112C and allows for energy 113C to easily dissipate from the energy element 112C. For example, the phase change material 102C may be grown in a grid pattern or other pattern with openings among the phase change material over the energy element 112C rather than being continuous over the energy element 112C. In certain embodiments, the phase change material 102C may be somewhat or entirely transparent and/or be at a depth that does not inhibit propagation of energy 113C from the energy element 112C to reach a wafer 106C. Accordingly, although the phase change material 102C may be grown on a specific portion of the energy element 112C, the phase change material may be grown in any particular location of the energy element 112C as desired for different applications, in various embodiments.

Figure 1D:
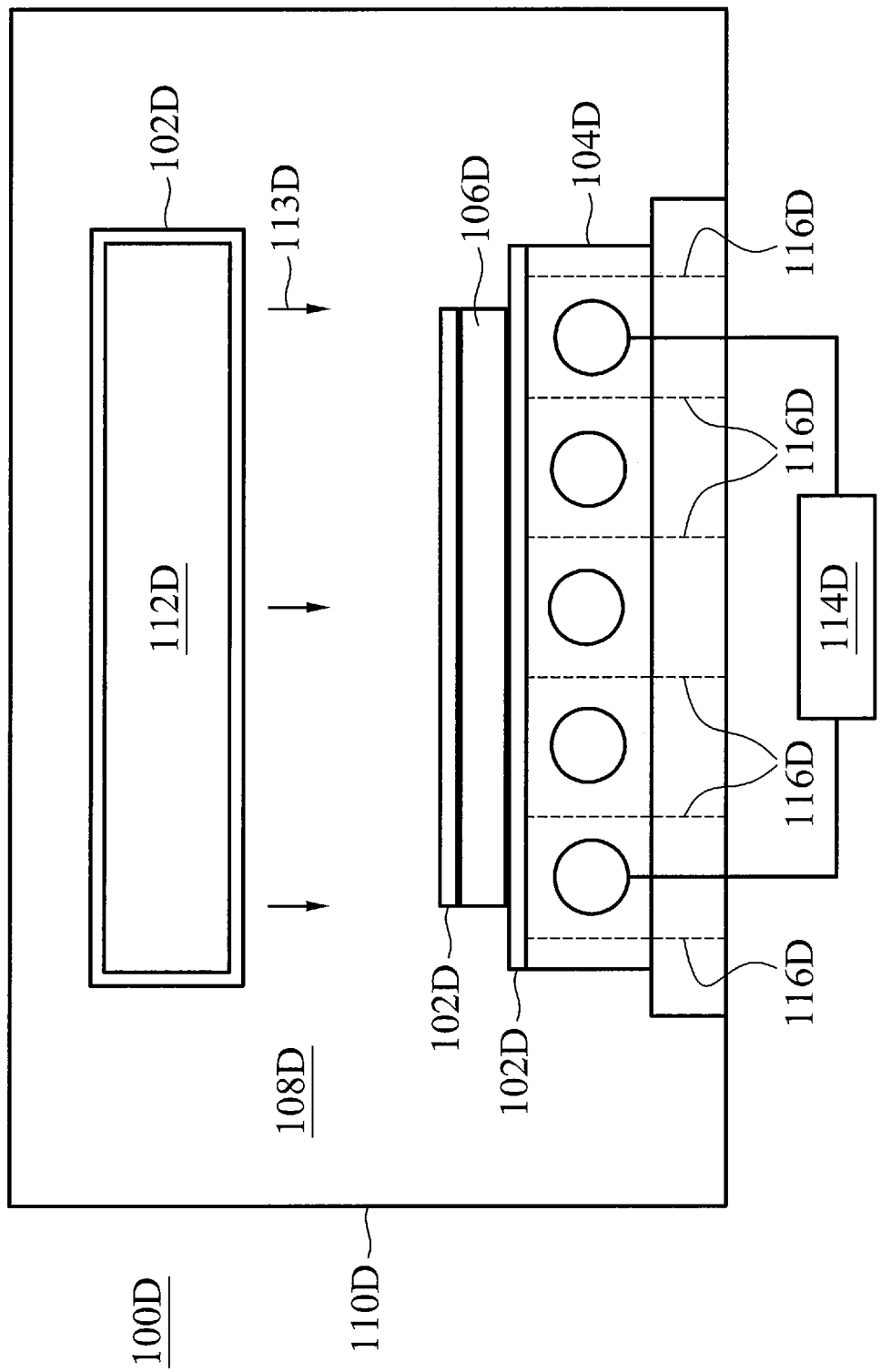
FIG. 1D is a cross sectional view of a chamber with phase change material grown on an energy element, wafer, and solid support structure, in accordance with some embodiments.

FIG. 1D is a cross sectional view of a solid processing chamber 100D with phase change material 102D on an energy element 112D, wafer 106D, and solid support 104D, in accordance with some embodiments. Various aspects of FIG. 1D (e.g., the chamber 100D, solid support structure 104D, wafer 106D, enclosed processing region 108D, chamber walls 110D, energy element 112D, energy 113D, and heat exchanging device 114D, resistance measuring apparatus 116D) may be similar to corresponding aspects of FIG. 1A and will not be repeated here for brevity. However, different than FIG. 1A, FIG. 1C illustrates an embodiment in which the phase change material 102D is grown on each of the solid support structure 104D, wafer 106D and the energy element 112C. Also, although the phase change material 102D may be grown on a specific portion of the chamber 100D, the phase change material may be grown in any particular location of the chamber 100D as desired for different applications, in various embodiments. For example, the phase change material may generally coat the entire interior surface of a chamber (e.g., the interior surface of the enclosed processing region 108D aside from removable components such as a wafer), in certain embodiments.

Figure 1E:
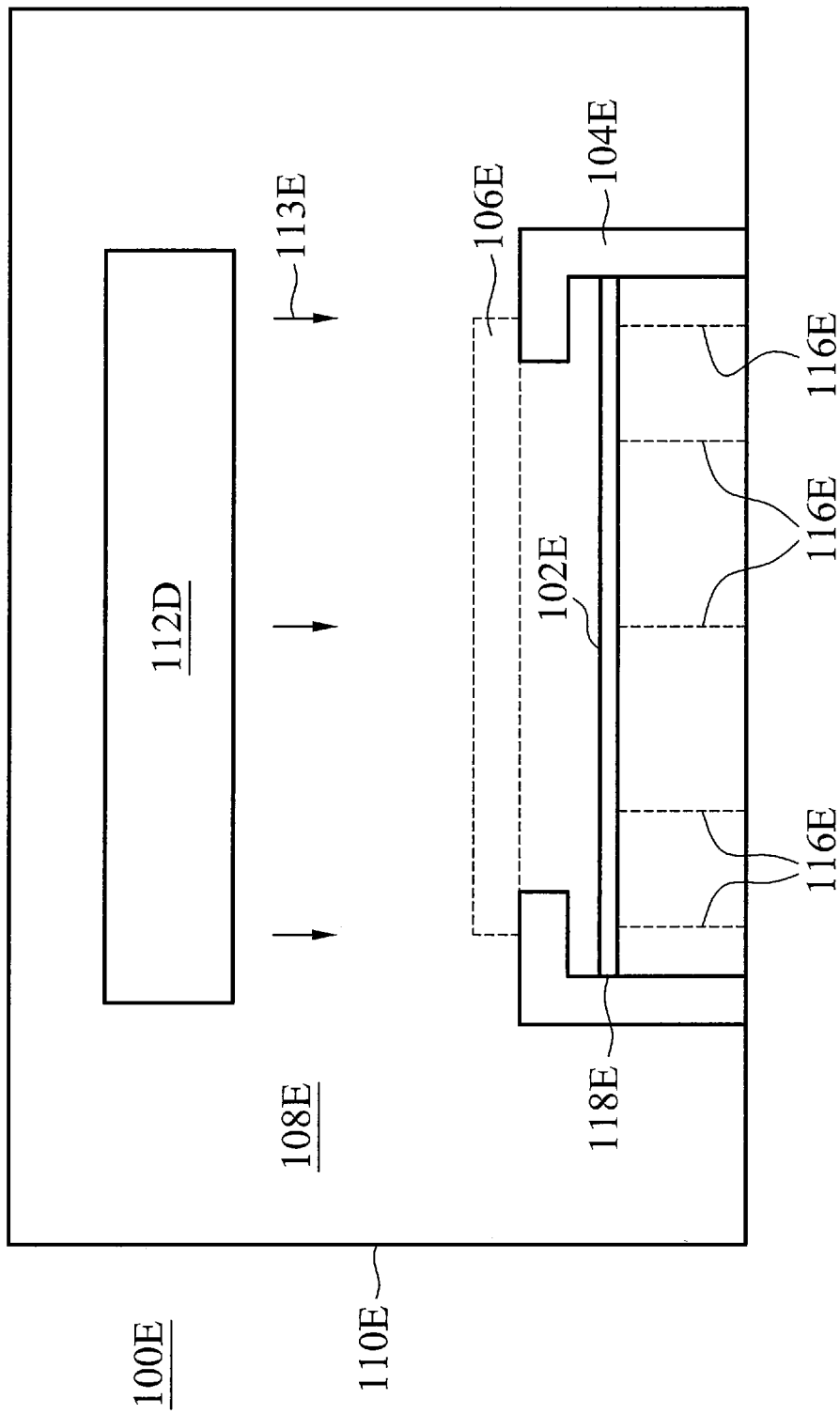
FIG. 1E is a cross sectional view of a chamber with phase change material grown on an open support structure, in accordance with some embodiments.

FIG. 1E is a cross sectional view of an open support processing chamber 100E with phase change material 102E grown on an open support structure 104E, in accordance with some embodiments. Various aspects of FIG. 1E (e.g., the chamber 100E, wafer 106E, enclosed processing region 108E, chamber walls 110E, energy element 112E, energy 113E, and heat exchanging device 114E) may be similar to corresponding aspects of FIG. 1A and will not be repeated here for brevity. However, different than FIG. 1A, FIG. 1E illustrates an embodiment in which the support structure for the wafer 106E is an open support structure 104E. In certain embodiments, the open support structure 104E may be a support ring that is rotatable. By being an open support structure 104E, the support structure that secures a wafer within the chamber 100E may have an opening under the wafer 106E. Specifically, the chamber 100E may have a reflective surface 118E under both the open support structure 104E and the wafer 106E when disposed or secured on the open support structure 104E. The reflective surface 118E may reflect energy to a backside of the wafer 106E to facilitate uniform heating for the wafer 106E.

Also, different than FIG. 1A, FIG. 1E illustrates how the phase change material 102E may be grown on the reflective surface 118E beneath the wafer 106E. Although the phase change material 102E is illustrated as grown on a specific portion of the reflective surface 118E, the phase change material may be grown in any particular location of the reflective surface 118E as desired for different applications, in various embodiments. For example, the phase change material may intermittently coat the entire surface of the reflective surface 118E (e.g., with opening(s) within the coating), in certain embodiments.

In certain embodiments, the chamber 100E may have resistance measuring apparatus 116E (e.g., an ohmmeter) at interface points along at least two points of the phase change material 102E to monitor the resistance (and according thermal change) within the chamber 100E. The interface points of the resistance measuring apparatus 116 are drawn using lines in phantom. As discussed above, by being along at least two points of the phase change material, the resistance measuring apparatus 116 may measure the resistance of the phase change material 102E between the at least two points.

Figure 1F:
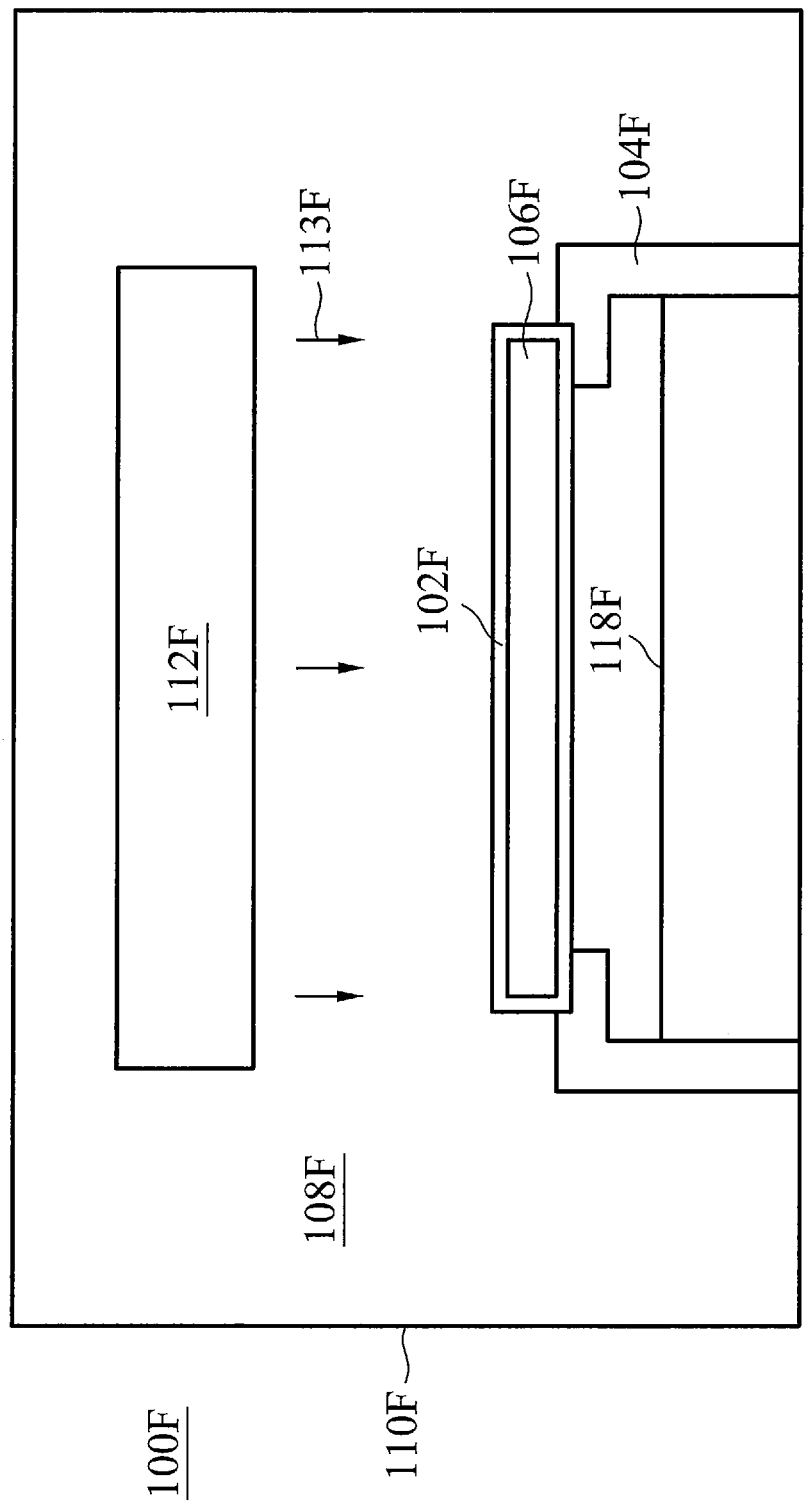
FIG. 1F is a cross sectional view of a chamber with phase change material grown on a wafer, in accordance with some embodiments.

FIG. 1F is a cross sectional view of an open processing chamber 100F with phase change material 102F grown on a wafer 106F, in accordance with some embodiments. Various aspects of FIG. 1F (e.g., the chamber 100F, open support structure 104F, wafer 106F, enclosed processing region 108F, chamber walls 110F, energy element 112F, energy 113F, heat exchanging device 114F, and reflective surface 118F) may be similar to corresponding aspects of FIG. 1E and will not be repeated here for brevity. However, different than FIG. 1E, FIG. 1F illustrates an embodiment in which the phase change material 102F is grown on the wafer 106F rather than on the reflective surface 118F. Also, the wafer 106B may be a test wafer (in contrast with a workpiece wafer, discussed above). Accordingly, the wafer 106B may be utilized specifically for thermal performance assessment, as opposed to being a semiconductor device workpiece.

As introduced above, reflective surface 118F may reflect energy 113F to a backside of the wafer 106F to facilitate uniform heating for the wafer 106F. Accordingly, phase change material may be grown on the backside of the wafer 106F as well for thermal performance assessment along the backside of the wafer 106F. In particular embodiments, the phase change material 102F may be grown throughout the wafer. In certain embodiments, the phase change material 102F may be somewhat or entirely transparent and/or be at a depth that does not inhibit propagation of energy 113F from the energy element 112F to reach the wafer 106F. Although certain embodiments discuss the phase change material 102F grown on a specific portion of the wafer 106F (e.g., along the top of the wafer facing the energy element 112F and/or along the bottom of the wafer facing the reflective surface 118F), in other embodiments the phase change material may be grown in other locations of the wafer as desired for different applications, in various embodiments. For example, the phase change material may be only on a single side of the wafer or part of a side of the wafer.

Figure 2:
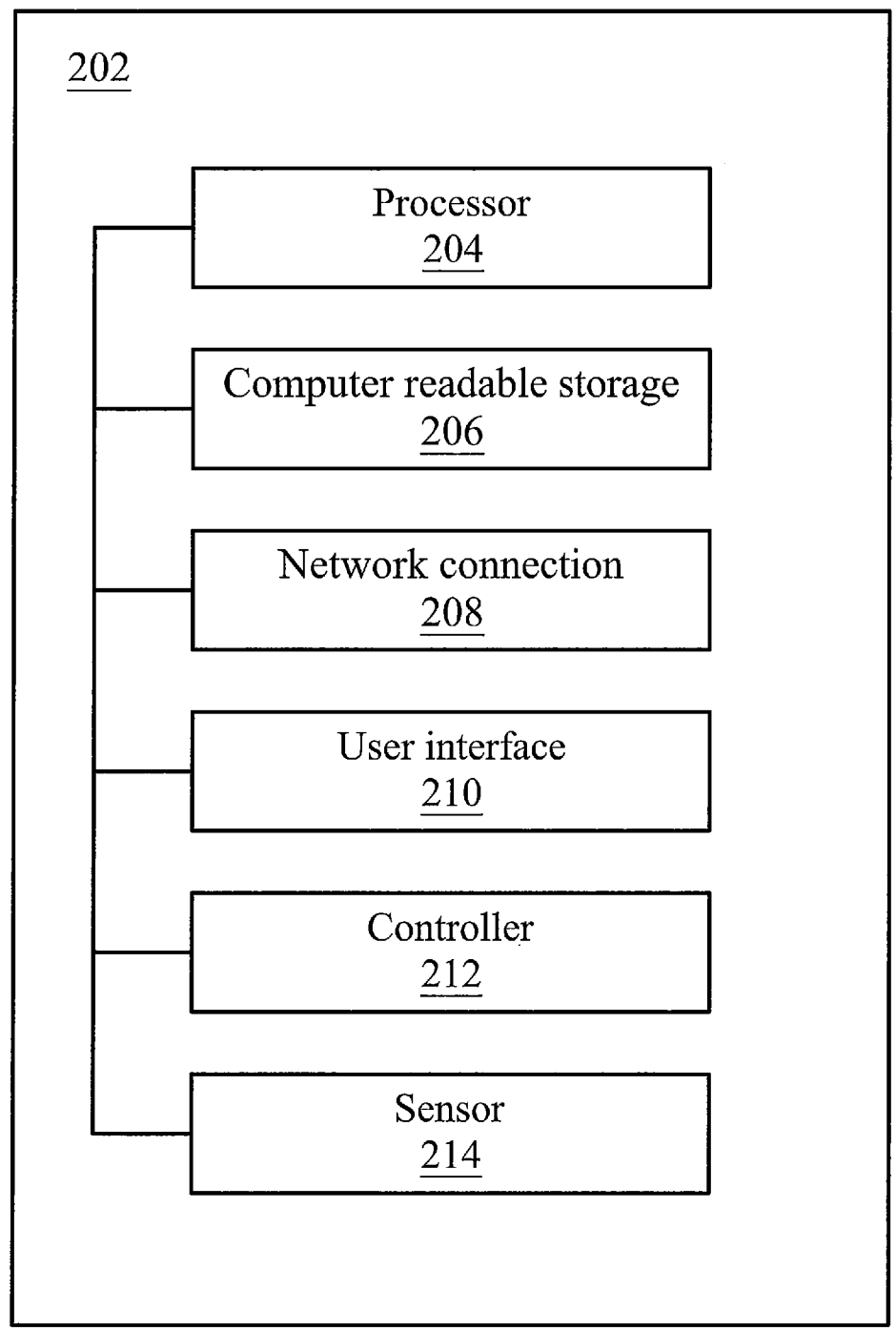
FIG. 2 is a block diagram of various functional modules of a phase change material thermal assessment system, in accordance with some embodiment.

FIG. 2 is a block diagram of various functional modules of a chamber assessment system 202 for assessing thermal performance of semiconductor workpiece fabrication processes utilizing phase change materials, in accordance with some embodiment. The chamber assessment system 202 may be part of the chamber that includes phase change materials, as discussed above. The chamber assessment system 202 may include a processor 204. In further embodiments, the processor 204 may be implemented as one or more processors.

The processor 204 may be operatively connected to a computer readable storage module 206 (e.g., a memory and/or data store), a network connection module 208, a user interface module 210, a controller module 212, and a sensor module 214. In some embodiments, the computer readable storage module 206 may include chamber assessment logic that may configure the processor 404 to perform the various processes discussed herein. The computer readable storage may also store data, such as sensor data collected by resistance measuring apparatus, identifiers for a wafer, identifiers for a chamber, identifiers for a semiconductor workpiece fabrication process, sensor data patterns, and any other parameter or information that may be utilized to perform the various processes discussed herein.

The network connection module 208 may facilitate a network connection of the chamber assessment system 202 with various devices and/or components of chamber assessment system 202 that may communicate (e.g., send signals, messages, instructions, or data) within or external to the chamber assessment system 402. In certain embodiments, the network connection module 208 may facilitate a physical connection, such as a line or a bus. In other embodiments, the network connection module 208 may facilitate a wireless connection, such as over a wireless local area network (WLAN) by using a transmitter, receiver, and/or transceiver. For example, the network connection module 208 may facilitate a wireless or wired connection with a calibration sensor, the processor 204 and the controller module 212.

The chamber assessment system 202 may also include the user interface module 210. The user interface may include any type of interface for input and/or output to an operator of the wafer pod calibration system, including, but not limited to, a monitor, a laptop computer, a tablet, or a mobile device, etc.

The chamber assessment system 202 may include a controller module 212. The controller module 412 may be configured to control various physical apparatuses that control movement or functionality for a wafer, energy element, or chamber. For example, the controller module 412 may be configured to control movement or functionality for at least one of a robotic arm that moves the wafer, a door of the chamber, the setting of the energy element (e.g., heaters or probes), frequency of phase change material resetting, and the like. For example, the controller module 412 may control a motor or actuator that may move or activate at least one of a robotic arm, energy element, and/or a door of a chamber. The controller may be controlled by the processor and may carry out the various aspects of the various processes discussed herein.

The sensor module 214 may represent the resistance measuring apparatus (e.g., an ohmmeter) in the context of the chamber assessment system 202. The sensor module 214 may include interface points along at least two points of a phase change material. By being along at least two points of the phase change material, the resistance measuring apparatus may measure the resistance of the phase change material between the at least two points. During and/or after the performance of the relevant semiconductor workpiece fabrication process, the resistance of the phase change material at any target location (e.g., across two points) may be measured and analyzed for thermal performance assessment by the sensor module. Also, the sensor data captured by the sensor module may be stored in the computer readable storage module 206 and compared to known resistances across known points to determine the thermal change over an increment of time. The correspondence between resistance and thermal changes may be well known or predetermined and thus not discussed herein for brevity.

Figure 3A:
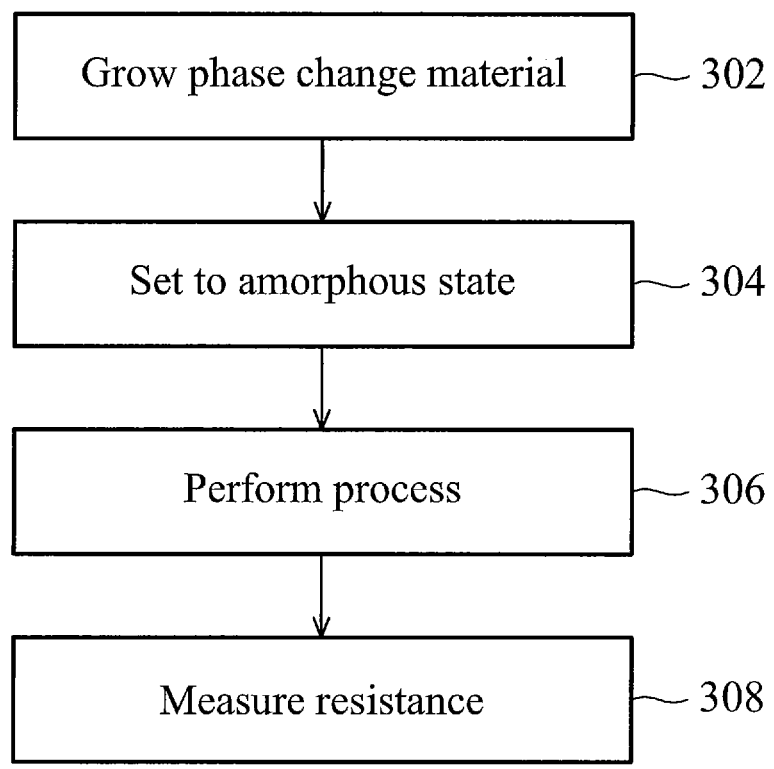
FIG. 3A is a flow chart of a phase change material thermal assessment process, in accordance with some embodiments.

FIG. 3A is a flow chart of a phase change material thermal assessment process, in accordance with some embodiments. The phase change material thermal assessment process may be performed by a chamber assessment system in conjunction with the various components of a chamber (e.g., a wafer), as discussed above. It is noted that the process 300 is merely an example, and is not intended to limit the present disclosure. Accordingly, it is understood that additional operations may be provided before, during, and after the process 300 of FIG. 3, certain operations may be omitted, certain operations may be performed concurrently with other operations, and that some other operations may only be briefly described herein.

At operation 302, a phase change material may be grown. As introduced above, phase change material may be grown for any location of a chamber for which thermal performance assessment may be desired. For example, the phase change material may be grown on a wafer that may be selectively disposed within the chamber, adjacent (e.g., on) on an energy element, adjacent a reflective surface, adjacent an open support structure and/or adjacent a solid support structure. Each of the places on which a wafer may be grown may be termed as a phase change material platform for ease of discussion. A phase change material may be grown on a phase change material platform in any conventional manner of growing phase change materials, such as via deposition or epitaxy. Accordingly, a detailed discussion of phase change material growth is omitted for brevity.

At operation 304, the phase change material may be set to an amorphous state. As introduced above, the phase change material may be set to an amorphous state using a probe of an energy element that is part of a chamber. The probe may be configured to set the phase change material to its high conductive amorphous state by Joule heating induced by energy pulses (e.g., electrical or light pulses). To switch to an amorphous state, a short reset pulse with high current may increase the temperature of the phase change material to a value above the melting point. After the pulse, the molten state cools rapidly (e.g., $10^{11}$ K/s) and is quenched into the amorphous state. To convert the material back into a crystalline state, a semiconductor workpiece fabrication process may be applied to heat the material above its crystallization temperature but below the melting point. The duration of the set pulse may be longer than the material dependent crystallization time to reset the phase change material.

At operation 306, a semiconductor workpiece fabrication process may be performed with the phase change material. As introduced above, the semiconductor workpiece fabrication process may be any type of process for semiconductor device fabrication for which a thermal performance assessment may be made. For example, semiconductor workpiece fabrication processes may be utilized and be part of in any type of tool, such as rapid thermal processing (RTP) tools, rapid thermal anneal (RTA) tools, physical vapor deposition (PVD) tools, dynamic surface annealing (DSA) tools, chemical vapor deposition (CVD) tools, chemical mechanical planarization (CMP) tools, diffusion (DM) tools, wet etching tools, dry etching tools, and the like. The functionalities and configurations of each tool is conventional (e.g., well known) and will not be discussed in detail herein for brevity.

At operation 308, resistance across two points of the phase change material may be measured. When measuring resistance, a much lower current with essentially no Joule heating may be used. Further details of setting and resetting phase change materials is discussed above and will not be discussed in detail here for brevity. Also, each particular phase change material may react to produce a high conductive amorphous state by respective and known Joule heating levels. According, specific values of Joule heating levels will not be discussed herein for brevity.

Figure 3B:
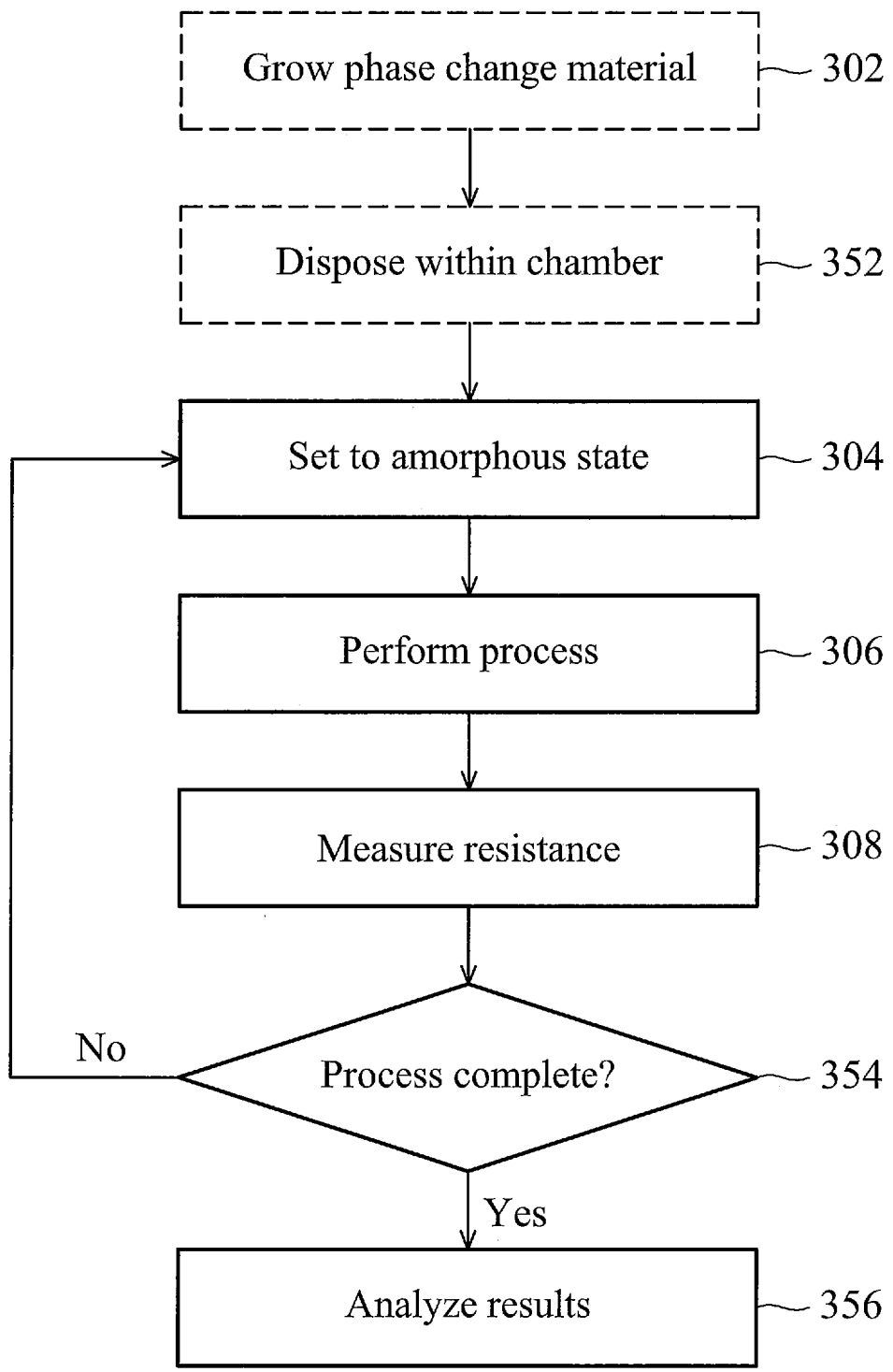
FIG. 3B is a flow chart of a phase change material continuous thermal assessment process, in accordance with some embodiments.

FIG. 3B is a flow chart of a phase change material continuous thermal assessment process 350, in accordance with some embodiments. Different than the phase change material thermal assessment process 300 of FIG. 3A, the phase change material continuous thermal assessment process 350 of FIG. 3B may reflect a continuous process where thermal performance assessment may be made with resistance measurements (e.g., thermal performance data, or sensor data) that may be measured before the semiconductor workpiece fabrication process is complete. For example, assessments may be made at any of a variety of granularities, such as within and up to a megahertz (MHz) or a million times per second, allowing for practically continuous monitoring of thermal changes during a semiconductor workpiece fabrication process. Furthermore, various operations may be similar to the operations discussed above in connection with FIG. 3A and will be similarly numbered and not repeated in detail here for brevity.

The phase change material continuous thermal assessment process 350 of FIG. 3B may be performed by a chamber assessment system utilizing the various components of a chamber (e.g., a wafer), as discussed above. It is noted that the process 350 is merely an example, and is not intended to limit the present disclosure. Accordingly, it is understood that additional operations may be provided before, during, and after the process 350 of FIG. 3B, certain operations may be omitted, certain operations may be performed concurrently with other operations, and that some other operations may only be briefly described herein.

At operation 302, phase change material may be grown as discussed above. At operation 352, the phase change material may be disposed within the chamber. As introduced above, phase change material may be grow on a wafer and subsequently inserted into a chamber after being grown on a wafer (e.g., a test wafer). Also, phase change materials may be grown on a phase change material platform that is subsequently assembled to form the chamber, and thus be disposed within the chamber. However, in various embodiments, the phase change material may be grown in situ within the chamber. Accordingly, in particular embodiments, operation 352 is illustrated in phantom to show that operation 352 may be optional, or may be considered to be part of operation 302.

At operation 304, the phase change material may be set to an amorphous state, as discussed above. Also, at operation 306, a semiconductor workpiece fabrication process may be performed with the phase change material, as discussed above. At operation 308, resistance across two points of the phase change material may be measured, as discussed above.

At operation 354, a decision may be made as to whether the phase change material continuous thermal assessment process 250 has completed the process of collecting sensor data (e.g., resistance values). If not (e.g., no), the phase change material continuous thermal assessment process 250 may return to operation 304 where the phase change material may be reset to an amorphous state, as discussed above. If so (e.g., yes), the phase change material continuous thermal assessment process 250 may proceed to operation 356.

At operation 356, the results of the collected sensor data may be analyzed. In certain embodiments, the collected sensor data may be analyzed over time from multiple iterations of setting and resetting the phase change material. Accordingly, by analyzing the aggregated data from various iterations of setting and resetting the phase change material, overall trends relevant to thermal performance assessment may be determined. In certain embodiments, defects related to semiconductor workpiece fabrication processes (e.g., defects or faults in the energy element and/or processing operations) may be detected from outliers in aggregated data from various iterations of setting and resetting the phase change material over time and/or across different sessions of phase change material continuous thermal assessment processes (e.g., where data from multiple chambers of the same type of tool may be compared with each other). In certain embodiments, these outliers may determine threshold values, which when passed, may define a particular defect. These outliers may be determined in accordance with conventional statistical analysis for outliers.

In an embodiment, a method includes: growing a phase change material on a platform configured for a semiconductor workpiece process; setting the phase change material to an amorphous state; performing the semiconductor workpiece process within a semiconductor processing chamber; and measuring resistance across two points along the phase change material.

In another embodiment, a method includes: setting a phase change material to an amorphous state on a platform configured for a semiconductor workpiece process; performing the semiconductor workpiece process within a semiconductor processing chamber; and measuring resistance across two points along the phase change material.

In another embodiment, a system includes: a chamber configured to process a semiconductor workpiece deposited therein; a phase change material disposed on a platform configured for processing of the semiconductor workpiece within the chamber; a probe configured to set the phase change material to an amorphous state; a heating element; and contacts disposed on the phase change material, the contacts configured for input into an ohmmeter.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
   growing a phase change material on a platform configured for a semiconductor workpiece process;
   setting the phase change material to an amorphous state;
   performing the semiconductor workpiece process within a semiconductor processing chamber, wherein the semiconductor workpiece process comprises at least one of: rapid thermal processing (RTP), physical vapor deposition (PVD) or dynamic surface annealing (DSA); and
   measuring a resistance across two points along the phase change material, wherein the resistance is measured across the two points while performing the semiconductor workpiece process.

2. The method of claim 1, wherein the measuring the resistance across the two points along the phase change material is performed within the semiconductor processing chamber.

3. The method of claim 1, further comprising:
   growing the phase change material on the platform within the semiconductor processing chamber.

4. The method of claim 1, further comprising:
   applying an energy pulse via a probe within the semiconductor processing chamber to set the phase change material to the amorphous state.

5. The method of claim 1, wherein the setting the phase change material to the amorphous state occurs while performing the semiconductor workpiece process.

6. The method of claim 1, wherein the setting the phase change material to the amorphous state is performed while performing the semiconductor workpiece process.

7. The method of claim 1, wherein the platform is a wafer.

8. The method of claim 1, wherein the growing is a process of either deposition or epitaxy.

9. A method, comprising:
   setting a phase change material to an amorphous state on a platform configured for a semiconductor workpiece process;
   performing the semiconductor workpiece process within a semiconductor processing chamber, wherein the semiconductor workpiece process comprises at least one of: rapid thermal processing (RTP), physical vapor deposition (PVD) or dynamic surface annealing (DSA); and
   measuring a resistance across two points along the phase change material, wherein the measuring the resistance across the two points along the phase change material is performed while performing the semiconductor workpiece process.

10. The method of claim 9, wherein the phase change material abuts a heating element within the semiconductor processing chamber.

11. The method of claim 9, wherein the phase change material abuts a wafer location within the semiconductor processing chamber.

12. The method of claim 9, wherein the phase change material is GeSbTe alloy.

13. The method of claim 9, wherein the setting the phase change material to the amorphous state is performed while performing the semiconductor workpiece process.

14. The method of claim 9, further comprising:
applying an energy pulse via a probe within the semiconductor processing chamber to set the phase change material to the amorphous state.

15. A method, comprising:
growing a phase change material on a wafer configured for a semiconductor workpiece process;
performing the semiconductor workpiece process within a semiconductor processing chamber, wherein the semiconductor workpiece process comprises at least one of: rapid thermal processing (RTP), physical vapor deposition (PVD) or dynamic surface annealing (DSA);
setting the phase change material to an amorphous state while performing the semiconductor workpiece process; and
measuring a resistance across two points along the phase change material within the semiconductor processing chamber, wherein the resistance is measured across the two points while performing the semiconductor workpiece process.

16. The method of claim 15, further comprising:
growing the phase change material on the wafer within the semiconductor processing chamber.

17. The method of claim 15, further comprising:
applying an energy pulse via a probe within the semiconductor processing chamber to set the phase change material to the amorphous state.

18. The method of claim 15, wherein the phase change material abuts a heating element within the semiconductor processing chamber.

19. The method of claim 15, wherein the phase change material abuts a wafer location within the semiconductor processing chamber.

20. The method of claim 15, wherein the phase change material comprises GeSbTe alloy.

* * * * *